United States Patent [19]

Stoessl et al.

[11] Patent Number: 4,944,245
[45] Date of Patent: Jul. 31, 1990

[54] CRUCIBLE COVER FOR COATING INSTALLATION WITH AN ELECTRON BEAM SOURCE

[75] Inventors: Wilfried Stoessl, Götzis, Austria; Christian Beusch, Triesenberg, Liechtenstein; Martin Boesch, Azmoos, Switzerland; Peter Niggli, Vaduz, Liechtenstein

[73] Assignee: Balzers Aktiengesellschaft, Balzers, Liechtenstein

[21] Appl. No.: 464,941

[22] Filed: Jan. 16, 1990

[30] Foreign Application Priority Data

Sep. 2, 1989 [CH] Switzerland ............... 445/89

[51] Int. Cl.$^5$ ............... C23C 14/00
[52] U.S. Cl. ............... 118/726; 219/121.15
[58] Field of Search ............... 118/726; 219/121.15

[56] References Cited

U.S. PATENT DOCUMENTS 4,516,525 5/1985 Bourgeois ............... 118/726
4,632,059 12/1986 Flatscher ............... 219/121.15
4,724,796 2/1988 Ranke ............... 219/121.15

FOREIGN PATENT DOCUMENTS 2170823 8/1986 United Kingdom .

Primary Examiner—Richard Bueker
Attorney, Agent, or Firm—Notaro & Michalos

[57] ABSTRACT

A hood type cover (4) with lifting mechanism is engaged over a crucible (1) with several material pockets (2, 3). By means of the lifting mechanism, the distance between a surface (5) of the crucible and a seal (8) on the cover (4) is varied. The lifting mechanism comprises a track (12) disposed on the wall (16) of the crucible (1). Engaged in this track are guided elements which are connected to the cover and are forcibly guided and moved upon rotary movements of the crucible (1). These guiding elements bring about a pivoting of the cover (4) or a displacement of the cover (4) or of the crucible (1) parallel to the central axis (17) of the crucible (1). This arrangement of the cover (4) permits a safe positioning of the material pockets (2, 3) inside the vacuum chamber of a coating installation.

15 Claims, 3 Drawing Sheets

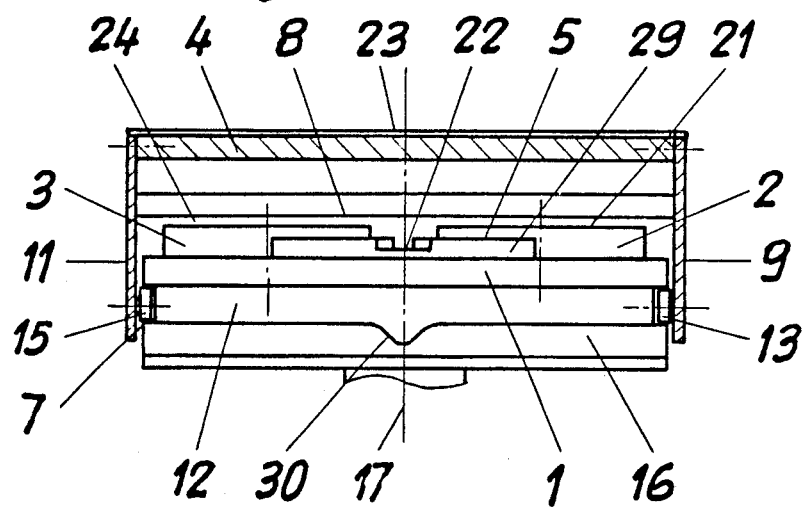
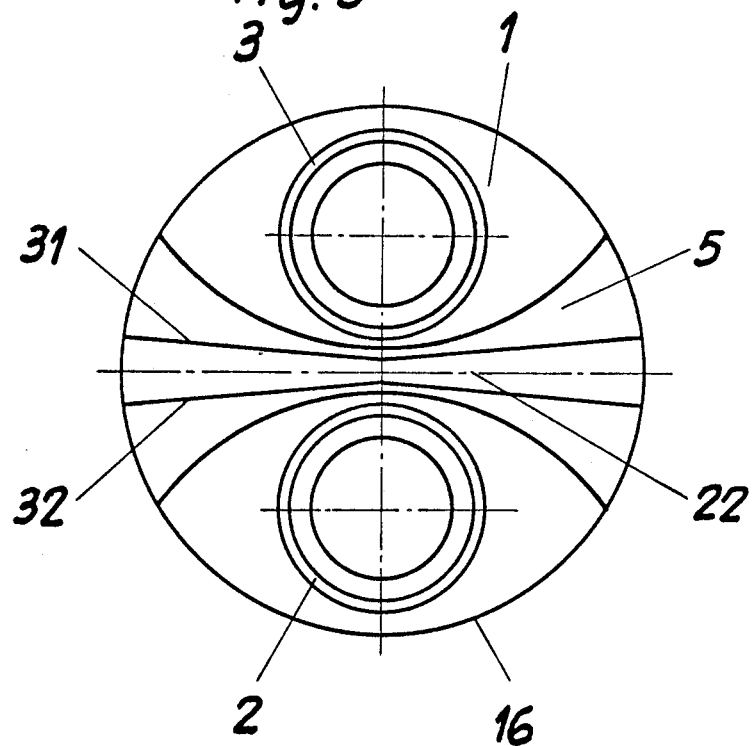

CRUCIBLE COVER FOR COATING INSTALLATION WITH AN ELECTRON BEAM SOURCE

FIELD AND BACKGROUND OF THE INVENTION

The present invention relates to a crucible cover for vacuum coating installations with an electron beam source acting as the energy source, and a pivotable or rotatable crucible having several material pockets. The cover covers the material pockets which are not to be heated by means of the energy source during at least one phase of the coating process.

In known vacuum coating methods, as for example by means of thermal vaporization by electron beam guns, the objects to be coated are introduced into a vacuum chamber. In installations for applying different layers in the same process, this vacuum chamber contains a crucible with several material pockets holding the various materials. Such a device is known from Swiss patent No. 663,037 where the crucible is installed in the device, or respectively in the source, in such a way that rotary or pivoting movements of the crucibles are possible. This makes it possible to bring the pocket containing the coating material into the desired position for vapor deposition. Cooling devices are also present as well as energy sources or electron beam sources for melting and vaporizing the coating material in the desired material pocket. When applying several layers of different materials successively on the objects to be vapor-treated in such an apparatus, for example in the production of electronic chips, the vacuum chamber must not be opened before the end of the treatment process. Otherwise uncontrolled reactions will result in the interface regions between the individual layers, and the vacuum conditions will no longer comply with the requirements of the process. This results in unusable products of very expensive substrates. In these processes crucibles are used which contain two, three, four or more material pockets, each of which may be filled with a different coating material. The pockets whose content is not being vaporized must be covered during the process, to avoid contamination of their content with the coating material being processed.

From Swiss patent document CH 663,037-A5 (U.S. Pat. No. 4,748,935) the use of a cover is known to protect against contamination of those parts of the crucible which are not needed during a certain process step. These known covers are fixed and lowered onto the surface of the crucible or the pockets as close as possible, to prevent contamination. With the use of highly dispersive coating materials, such as gold, or in the case of large crucible volumes, the danger of so called "cross-talk" or cross-contamination between pockets is increased, owing to which further contamination occurs. This is not desired if especially stringent requirements are set for coating quality. Highly dispersive materials may also interfere with the succession of movements of the crucible. These interferences are attributable to the fact that in the gap zones between the cover and the crucible as well as the pockets, material deposits which is vaporized in the instantaneous coating process and, after a certain time, movement of the crucible can no longer be carried out. As a result, the vacuum chamber must be vented to be able to clean the crucible and the cover, so that on the one hand interruptions of operations result and on the other hand the quality of the substrates being processed in the vacuum chamber can no longer be guaranteed. The substrates must be treated as scrap, resulting in very high losses, since in most cases very expensive objects are involved.

SUMMARY OF THE INVENTION

It is an object of the present invention to provide a crucible cover which offers high safety of operation, ensures complete shielding from contamination of the material pockets not needed in a certain process step, is easy to produce, and has high operating safety in the region of the vacuum chamber. Further it is an object of the invention to avoid, by means of this apparatus, interruptions in operation and thereby to reduce scrap costs.

A still further object of the present invention is to provide a crucible cover assembly for a coating apparatus having an electron beam source as an energy source for heating material to be vaporized, the assembly comprising a support block, a crucible having a plurality of material pockets for receiving material to be vaporized, mounted for movement to the block, a cover mounted for movement to the block for covering at least one of the material pockets which are not to be heated by the energy source, a lifting mechanism operatively connected between the cover and the crucible for lifting the cover above the surface of the crucible to allow the crucible to move under the cover, and thereafter allowing the crucible to move toward the surface for covering the at least one material pocket, the cover having an edge with a seal for sealing against the surface of the crucible.

In the solution according to the invention, the lifting mechanism positioned between the crucible and the cover permits a gap-free, optically tight seal between the surface of the crucible and the sealing elements at the cover. With the lifting mechanism the cover is lowered onto the surface of the crucible as soon as the crucible is in the desired position. To position the crucible, pivoting or rotating means are usable in a known manner. Any deposits of coating material in the transitional region between cover and crucible surface cannot interfere with the motions of the crucible, since before every change of the crucible position the interstice between cover and crucible surface is increased by means of the lifting mechanism, and thus any deposits of material cannot hinder the motions of the crucible. The distance between cover and crucible can be changed by moving either the cover or the crucible. The invention can be applied to particular advantage by forcible actuation, if a track in the form of a slide block groove is disposed on the wall of the crucible and guiding elements are engaged in the track, which are connected to the cover. The track has a geometric form which is adapted to the number of pockets and to the magnitude of the desired movement steps. This ensures that the distance between cover and crucible surface is always large enough not to hinder movements of the crucible. This is ensured by the fact that the cover is lifted off the surface counter to a spring load as soon as a rotary or pivoting movement of the crucible, or respectively of the track on the wall of the crucible, takes place. To this end the track has depressions or elevations which, through the guiding elements, bring about the change of position of the cover. Because changes in position of the crucible are used for the actuation of the lifting device, there results an especially simple and reliable solution to the prior art problems. The solution according to the invention can also be installed very easily in existing installations and substantially increases the quality of the coatings applied on the substrates. Crosscontamination of the materials in the individual pockets does not occur, and thus purer layers are obtained. The entire control, the drive mechanism of the crucible, and also the heating of the material pockets require no changes when the apparatus according to the present invention is to be used. Depending on the chosen design, the cover is movable and the crucible stationary in an axial direction, or the crucible is displaceable in an axial direction and the cover is stationary. Both variants represent the solution according to the invention and lead to the desired better operating results.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

BRIEF DESCRIPTION OF THE DRAWINGS

In the drawings:

FIG. 2 is a simplified side view of the crucible with two material pockets and a cover lifted off the mechanism of the invention;

FIG. 3 is a top plan view of the crucible in the position illustrated in FIG. 1, with two material pockets.

DESCRIPTION OF THE PREFERRED EMBODIMENTS

Figure 1:
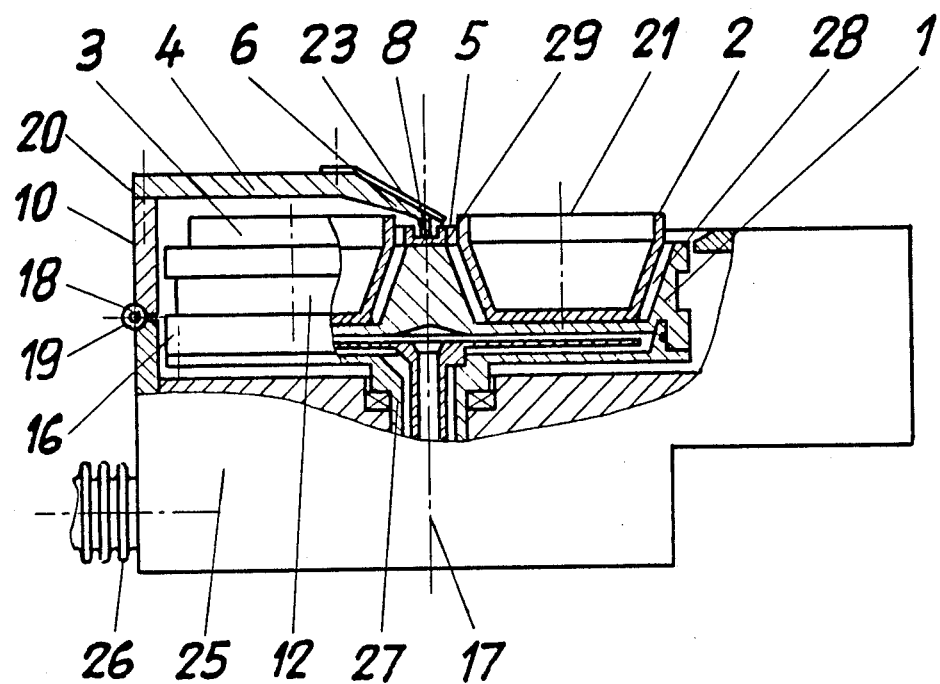
FIG. 1 is a partial sectional view taken through a cover according to the invention, as well as a crucible with respective accessory units.

FIG. 1 illustrates a source module from a coating installation comprising a crucible 1, a cover 4, and a support block 25. The support block 25 contains drive systems (not shown) and a cooling system for the crucible 1 as well as the electron beam unit serving to heat the material to be vaporized in material pockets 2 and 3. A connecting line 26 contains control and energy feed lines and connects the support block 25 to the other modules of the coating installation. When the installation is in operation, the module shown is positioned in a vacuum chamber, and all suspensions and connected lines are designed accordingly. Crucible 1 is mounted on a shaft 27 and rotatable about a central axis 17. Shaft 27 is driven by a drive disposed in the support block 25. In the crucible 1, which has the form of a cylinder, two depressions 28 are provided, which are offset relative to each other by 180°. In each of these depressions 28 is one of the material pockets 2 and 3 which contains material to be vaporized by the electron source. The pockets are also called "liners". Alternatively, the material is introduced directly into the depressions 28. This material is heated and vaporized and applied as coating on the substrates disposed in the vacuum chamber. Such materials are for example gold, chromium, aluminum, as well as nickel or copper. The crucible 1 shown in FIG. 1 contains two liners or pockets 2, 3, each filled with different materials. This permits applying two different layers to the substrates in the same process without having to open the vacuum chamber. Only one of the two material pockets 2, 3 is acted upon and hence heated by the electron beam generated in the electron beam unit (not shown). In the example shown this is pocket 2. Pocket 3 is completely covered up by cover 4 in hood fashion. This cover 4 protects the contents of pocket 3 from contamination by material particles issued from pocket 2 and not impinging on the substrates, but impinging in the region of the source module.

To ensure satisfactory sealing, an intermediate piece 29 is set on crucible 1. Piece 29 is intersected by the central axis 17 and extends between the two material pockets 2, 3. The surface 5 of this intermediate piece 29, or respectively of the crucible 1, is arranged at least one millimeter lower than the top edge 21 of the pockets 2 or 3. The cover 4 covers one half of the disk-shaped crucible 1 and has, along its edge 6, seals 8 and is supported in the region 20 away from the heated pocket 2, at a rear apron 10, in a suspension 19 which is pivotable about an axis 18. Axis 18 is approximately at right angles to the central axis 17 of crucible 1. In addition, springs (not shown) are arranged on cover 4 which cause seal 8 to apply against the surface 5 of crucible 1 with a desired contact pressure. The contact pressure ensures the necessary cooling action. Between crucible 1 and cover 4 a lifting mechanism 7 (shown in FIG. 2) is disposed. Mechanism 7 comprises a track 12 on a side wall 16 of crucible 1 and guiding elements 13 and 15 which are connected to the cover 4 and create, as a function of the course of the track 12, a forcible pivoting movement of cover 4 about axis 18. Elements 13 and 15 may be in the form of rollers which are rotatably mounted to the aprons 9 and 11 of cover 4, and roll in track 12.

The mode of operation of the lifting mechanism 7 is better visible in FIG. 2, the crucible 1 being rotated 90° in FIG. 2 as compared with its position in FIG. 1. Track 12 extends around the entire wall 16 of crucible 1 and has two depressions 30. The number of depressions depends on the number of pockets present in crucible 1, i.e. two in the illustrated example. The depressions 30 are also offset by 180°. In the representation of FIG. 2, cover 4 is lifted off the surface 5 of crucible 1, owing to which the pockets 2, 3 can be brought into a new position unhindered by any sealing or structural elements. Cover 4 has the lateral aprons 9 and 11, on which are mounted the guiding elements 13 and 15. These guiding elements 13, 15 may be ball bearings, the outer races of which are guided by the track 12 and which nevertheless ensure unhindered rotation of the crucible 1 about the central axis 17. Between the aprons 9 and 11 as well as the crucible 1, or respectively the intermediate piece 29 belonging to the crucible, additional sealing parts (not shown) are arranged. If crucible 1 is rotated out of the position shown in FIG. 2 in any direction about the central axis 17, the guiding elements 13, 15 will, after 90° of rotation, reach the region of the depressions 30. As the cover 4 is spring-loaded toward the crucible, it is pulled down when the guiding elements 13, 15 run into the depressions 30, whereby the edge 6 with the seal 8 is lowered onto the surface 5 of the intermediate piece 29. The seal 8 then engages in a groove 22 of surface 5, and brings about, due to the closing forces acting on cover 4, a satisfactory seal between crucible surface 5 and seal 8. If one of the material pockets 2, 3 is to be brought into a different operating position, crucible 1 is again rotated about the central axis 17, with the result that the guiding elements 13, 15 are raised because they are forcibly brought out of the depression 30. Thereby also cover 4 is raised until a sufficiently large free passage 24 is created between the top edge 21 of the material pockets 2, 3 and seal 8. To ensure satisfactory mobility, groove 22 has a specific form as shown in FIG. 3. Groove 22 widens from the center of crucible 1, so that its width increases outwardly. This design permits delayed running out of the guiding elements 13, 15 from the depression 30 and a resultant delayed extraction of the seal 8 from groove 22 without having the seal engage against the edge regions 31, 32 of groove 22.

To improve the operation and lengthen the life of the device, protection elements or cover sheets 23 are disposed in the area of edge 6 on cover 4, as shown in FIGS. 1 and 2. These protection elements can be taken off easily and quickly, so that they are easy to exchange. Since it cannot be completely avoided that coating material which vaporizes from pocket 2, precipitates not only on the substrate but also on other parts in the vacuum chamber, a coating builds up on the protection element 23 during the work cycle. As soon as this build up becomes too great, element 23 is exchanged and replaced by a new, uncoated one. Because the edge regions 21 of the pockets 2, 3 are elevated relative to the surface 5 of crucible 1 and of the intermediate piece 29 belonging to the crucible, material particles issuing from pocket 2 are prevented from striking the seal 8 directly and building up a coating thereon. In addition, this protection is ensured by the projecting edge of the protection element 23.

The apparatus according to the invention thus affords a safe covering of the material pockets which are not participating in a particular phase of the coating process, in the illustrated example the pocket 3, and ensures at the same time the safe pivoting of this pocket 3 into the operating position and, in parallel therewith, the pivoting of pocket 2 into the reserve position. This solution is especially effective if there are more than two material pockets in crucible 1 and substrates with complex layer construction are, produced. The arrangement according to the invention ensures trouble-free working during the entire process and prevents contamination of the material in any of the pockets disposed on crucible 1 by vaporizing material of another pocket. Thereby the quality of the produced coatings is increased and simultaneously the scrap quota is greatly reduced. This is attributable in particular to the fact that while a batch is being processed the rotary and pivoting movements of crucible 1 can be carried out unhindered without affecting the operation of the cover 4. Flooding of the vacuum chamber during a cycle as a result of disturbances between cover 4 and crucible 1 is thus completely avoided. The critical parts such as protection element 23 and intermediate piece 29 can, if necessary, be readily exchanged during maintenance or down times, so that optimum mechanical conditions are created.

Figure 4:
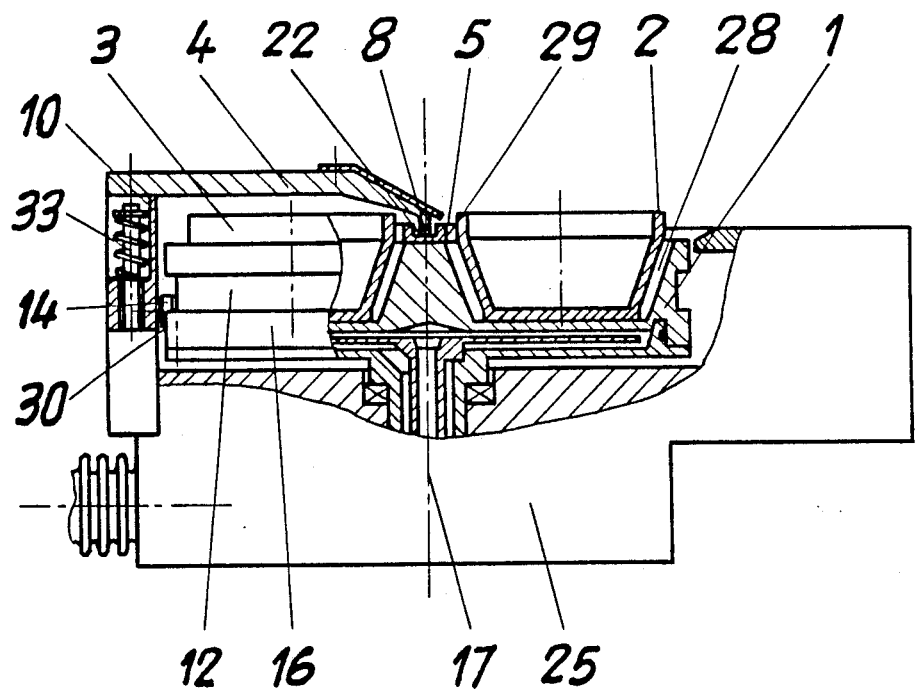
FIG. 4 is a view similar to FIG. 1 of an embodiment of the invention with a lifting mechanism for parallel displacement of the cover.

In FIG. 4, where the same reference numerals are used to designate the same or similar parts, a form of the cover 4 is displaceable parallel to the central axis 17 rather than being pivotable. To this end, there are disposed at the rear apron 10, as well as at the lateral aprons 9 and 11 (not shown in FIG. 4), guides 33 which are fixed to block 25 and permit movement of the cover 4 parallel to the central axis 17. To assure this movement satisfactorily, at least three guides 33 are necessary, which in the illustrated example are offset by 90° each. There are also three guiding elements 14, which cooperate in track 12 with four depressions 30 which are offset by 90°. This arrangement is suitable for crucibles 1 with four depressions 28, or respectively material pockets 2, 3. A spring is also engaged between each guide 33 and cover 4 to bias cover 4 toward crucible 1.

If crucible 1 has only two depressions 28 for the material pockets 2 and 3, track 12 will have two depressions 30, which here again are offset by 180°. Transmission of the displacement movement of cover 4 from the guiding element 14 at the rear apron 10 to the guiding elements at the lateral aprons 9 and 11 is effected by mechanical auxiliary means (not shown) or by the fact that on the wall 16 of crucible 1 two tracks 12 are arranged, of which one serves to guide the guiding element 14 at the rear apron 10, and the other to guide the guiding elements at the lateral aprons 9 and 11. These two tracks 12 then have two depressions 30 each, positioned in accordance with the guiding elements. When crucible 1 is rotated about the central axis 17, the guiding element 14 is deflected out of the depression 30 and causes displacement of the rear apron 10 upward. Because of guide 33, which is pin shaped and is slidably received in holes of cover 4, this movement occurs parallel to the central axis 17, whereby seal 8 is lifted off the surface 5 of the intermediate piece 29. Groove 22 has the same form as shown and described in FIG. 3. It is also evident from FIG. 4 that the crucible 1 may be designed so that it could be lowered in the direction of the central axis 17 and the cover 4 would then be stationary. With a suitable construction of the drive elements in the support block 25, this solution can easily be derived from the solution shown in FIG. 4.

While specific embodiments of the invention have been shown and described in detail to illustrate the application of the principles of the invention, it will be understood that the invention may be embodied otherwise without departing from such principles.

What is claimed is:

1. A crucible cover assembly for a coating apparatus having an electron beam as an energy source for heating material to be vaporized, comprising:
    a support block;
    a crucible mounted for movement to said support block and having a surface with a plurality of material pockets therein;
    a cover for covering at least one of the material pockets which are not to be heated by the energy source, said cover having at least one edge with a seal engageable with the crucible surface for sealing the cover to the crucible for covering the at least one material pocket; and
    a lifting mechanism operatively connected between said crucible and said cover for changing the distance between said cover and the crucible surface when the crucible moves for moving said seal away from the crucible surface so that a different material pocket can be moved, with movement of said crucible, under the cover.

2. An assembly according to claim 1 wherein said cover includes a plurality of lateral aprons engaged over sides of said crucible for shielding the at least one material pocket in hood like fashion.

3. An assembly according to claim 1 wherein said lifting mechanism comprises a track provided on one of said crucible and said cover, and a plurality of guiding elements connected to the other of said crucible and cover and guided for movement in said track with movement of said crucible on said support block.

4. An assembly according to claim 3 wherein said track is shaped to cause relative movement between said cover and said crucible with movement of said guide elements along said track for defining a free passage space between said crucible surface and said cover for allowing free movement of said crucible with respect to said cover to bring a different material pocket under said cover.

5. An assembly according to claim 3 wherein said track is disposed on a side wall of said crucible, said crucible being rotatably mounted to said support block about a central axis, said guiding elements being connected to said cover and being displaceable approximately parallel to said central axis with rotation of said crucible.

6. An assembly according to claim 5 wherein said cover is pivotally mounted to said support block about a pivot axis which extends approximately at a right angle to said central axis, said pivot axis being positioned on said cover at a location spaced away from said central axis.

7. An assembly according to claim 5 including a plurality of guides connected to said cover for guiding movement of said cover approximately parallel to said central axis with rotation of said crucible.

8. An assembly according to claim 1 wherein each of said material pockets has a top edge which extends toward said cover to a greater extent than said crucible surface.

9. An assembly according to claim 8 wherein said top edge extends at least one millimeter above said crucible surface.

10. An assembly according to claim 1 wherein said crucible surface includes a groove therein for receiving said seal, the width of said groove diverging outwardly from a center of said surface for allowing some relative rotation between said crucible and said cover before said cover is lifted from said crucible surface.

11. An assembly according to claim 1 including an exchangeable protection elements disposed over said cover.

12. An assembly according to claim 1 wherein said crucible is rotatable mounted to said support block, biasing means for biasing said cover toward said crucible surface, said lifting mechanism comprising a track disposed around an outer wall of said crucible and a plurality of guiding elements connected to said cover and moveably engaged in said track, said track having depressions therein for receiving said elements in a relative position between said cover and said crucible for lowering said cover against said crucible surface and for engaging said seal against said crucible surface, rotation of said crucible causing said cover to lift away from said crucible surface.

13. An assembly according to claim 12 wherein said cover is pivotally mounted to said support block.

14. An assembly according to claim 12 wherein said cover is slidably mounted for movement toward and away from said support block in a direction parallel to a rotation axis of said crucible.

15. An assembly according to claim 14 wherein said crucible surface has a groove therein for receiving said seal, said groove enlarging in a direction away from said rotation axis for allowing some relative rotation between said crucible and said cover before said seal is lifted from said groove.

* * * * *